(12) United States Patent
Gonzalez et al.

(10) Patent No.: US 10,431,994 B2
(45) Date of Patent: Oct. 1, 2019

(54) SELF-CONTAINED EVCS DISPLAY

(71) Applicant: SCHNEIDER ELECTRIC USA, INC., Schaumburg (IL)

(72) Inventors: Karla Morena Guajardo Gonzalez, Monterrey (MX); Gabriela Isabel Rubio Barraza, Monterrey (MX); Marcela Veronica Arizpe Rodriguez, Monterrey (MX); Jose Filiberto Escamilla Canedo, San Pedro Garza Garcia (MX); Pablo Alejandro Del Angel Marrufo, Monterrey (MX)

(73) Assignee: Schneider Electric USA, Inc., Boston, MA (US)

( * ) Notice: Subject to any disclaimer, the term of this patent is extended or adjusted under 35 U.S.C. 154(b) by 531 days.

(21) Appl. No.: 15/035,748

(22) PCT Filed: Dec. 27, 2013

(86) PCT No.: PCT/US2013/078063
§ 371 (c)(1),
(2) Date: May 10, 2016

(87) PCT Pub. No.: WO2015/099777
PCT Pub. Date: Jul. 2, 2015

(65) Prior Publication Data
US 2016/0297315 A1    Oct. 13, 2016

(51) Int. Cl.
*H02J 7/00* (2006.01)
*G07F 15/00* (2006.01)
(Continued)

(52) U.S. Cl.
CPC ............ *H02J 7/0021* (2013.01); *B60L 53/16* (2019.02); *B60L 53/665* (2019.02);
(Continued)

(58) Field of Classification Search
CPC . B60L 11/1848; B60L 11/1818; H02J 7/0021; G01R 31/3648; G07F 15/005; Y02T 90/128; Y02T 90/12
See application file for complete search history.

(56) References Cited

U.S. PATENT DOCUMENTS

| 5,013,992 | A | * | 5/1991 | Eavenson | ............... H02J 7/008 320/158 |
| 2006/0238459 | A1 | * | 10/2006 | Huang | ................. G09G 3/3283 345/76 |

(Continued)

FOREIGN PATENT DOCUMENTS

WO    WO-2013138784 A1  *  9/2013   ........... G01R 15/142

OTHER PUBLICATIONS

CW140 Clamp-on Power Meter, Yokogawa Technical Report English Edition, 2001.*
(Continued)

*Primary Examiner* — Daniel R Miller
(74) *Attorney, Agent, or Firm* — Locke Lord LLP

(57) ABSTRACT

A self-contained EVCS accessory is electrically engaged to an electric vehicle charging stations to derive one or more operational parameters during the electric vehicle charging process. The self-contained EVCS accessory includes a display unit that can display detailed information to the users regarding the charging process. The EVCS accessory uses its own built-in display unit and power supply to display the detailed information and requires no modification to the charging station. The detailed information, which may include the charging level, charging status, elapsed time, power transferred, cost of power, and the like, may be derived directly by the EVCS accessory or it may be obtained by the accessory from a predefined source of such information. Such an arrangement provides users with much
(Continued)

more meaningful information about the charging process compared to the LEDs or light indicators of existing charging stations.

14 Claims, 7 Drawing Sheets

(51) Int. Cl.
 *G01R 31/36* (2019.01)
 *B60L 53/16* (2019.01)
 *B60L 53/66* (2019.01)
(52) U.S. Cl.
 CPC ....... *G01R 31/3648* (2013.01); *G07F 15/005* (2013.01); *Y02T 90/12* (2013.01); *Y02T 90/128* (2013.01)

(56) References Cited

U.S. PATENT DOCUMENTS

| | | | | |
|---|---|---|---|---|
| 2009/0028653 A1* | 1/2009 | Wilbert | ................ | B25H 1/0071 408/76 |
| 2009/0091477 A1* | 4/2009 | McCall | .................. | G01S 19/42 340/990 |
| 2010/0182157 A1* | 7/2010 | Shaffer | .................... | H04Q 9/00 340/636.13 |
| 2010/0237985 A1* | 9/2010 | Landau-Holdsworth | .................... | B60L 3/0069 340/5.8 |
| 2011/0175569 A1* | 7/2011 | Austin | ................ | B60L 11/1824 320/109 |
| 2012/0139335 A1* | 6/2012 | Holland | .................. | B60L 1/006 307/9.1 |
| 2012/0319676 A1* | 12/2012 | El-Essawy | ......... | G01R 33/0283 324/126 |

OTHER PUBLICATIONS

Charging Station, available May 10, 2013 at https://en.wikipedia.org/wiki/Charging_station (Charging Station).*
Current Clamp, available May 14, 2013 at https://en.wikipedia.org/wiki/Current_clamp.*
Tenma Model 72-10445 Clamp Power Meter Clamp with Phase Sequence, available for purchase at least by Aug. 13, 2013 at https://www.amazon.com/Clamp-Power-Meter-Phase-Sequence/dp/B00NQBV8CE\.*
Extech Model 380940 True RMS AC / DC Power Clamp Meter User Manual, 2012.*

* cited by examiner

SELF-CONTAINED EVCS DISPLAY

FIELD OF THE INVENTION

The disclosed embodiments relate generally to a system and method for monitoring electric vehicle supply equipment (EVSE), and more particularly to a system and method for displaying detailed information about an electric vehicle charging station (EVCS).

BACKGROUND OF THE INVENTION

The rise in the use of electric vehicles, particularly electric cars, over the last few years due to environmental and other considerations has created a demand for EVCS to recharge the batteries of such vehicles. Charging stations have now been developed and deployed for residential use as well as commercial and fleet applications in most major markets. Such charging stations are expected to become more commonplace as interest in electric vehicles continues to grow and expand among the general population.

Early models of these charging stations were designed to provide users with only the minimum amount of information necessary for the users to be able to charge their electric vehicles. Most of these early charging stations only had a rudimentary display, typically one or more LEDs or indicator lights, and conveyed only basic information to the users. Nor did these charging stations typically have a human-machine interface (HMI) or other user interface to allow users to interact with the charging stations. Usually the front display of the charging stations had one LED to indicate the power status, another LED to indicate whether charging is proceeding normally, and another LED to indicate the presence of a system fault, and the like. Such basic information, while perhaps adequate for purposes of simply charging an electric vehicle, often left users longing for more detailed and meaningful information.

The above shortcoming is particularly acute in light of the wealth of information that is presently instantaneously available to users via their smartphones and other handheld communication devices. However, replacing existing charging stations with new charging stations that provide enhanced displays and user interfaces is an expensive option that may hold back wider acceptance of electric vehicles.

Thus, a need exists for a way to provide users of existing EVCS with more detailed and meaningful information during the charging process, and particularly for a way to provide users with detailed and meaningful information without having to modify or alter existing charging stations.

SUMMARY OF THE INVENTION

The disclosed embodiments are directed to a system and method of providing users of existing electric vehicle charging stations with more detailed and meaningful information during the charging process without altering or replacing existing charging stations. The system and method disclosed herein may be used for a variety of electric vehicle charging stations, including residential charging stations, commercial charging stations, fleet charging stations, and the like. In general, the disclosed system and method involve retrofitting existing charging stations with a self-contained EVCS accessory that can display more detailed and meaningful information to the users. The self-contained EVCS accessory requires no modification to an existing charging station, but instead uses its own built-in display unit and power supply to display detailed information regarding the charging process to users. The detailed information, which may include vehicle charge level, charging status, elapsed and remaining time, cost per kilowatt, total cost, power transferred, and the like, may be derived directly by the self-contained EVCS accessory, or it may be obtained by the accessory from a predefined source of such information. Such an arrangement provides users with much more meaningful information compared to the LEDs or light indicators of existing charging stations without needing to alter or replace the existing charging stations.

In some embodiments, the self-contained EVCS accessory may be in the form of a clamp having a display unit that may be clamped around the power cord of the charging station. In other embodiments, the self-contained EVCS accessory may be in the form of an adapter having a display unit that may be connected to the end of the power cord connector. The adapter may then be connected to the electric vehicle. Any suitable display unit capable of displaying numeric or alphanumeric information may be used as the display unit, including a flat-panel LED display, bistable LCD display, dynamic display, and the like. Once the accessory is clamped around the power cord, connected to the power cord, or otherwise engaged with the power cord, a current transformer such as a toroid transformer may be used to sense the current passing through the power cord. A current sense circuit may be connected to the current transformer and configured to output a signal indicative of the amount of current passing through the power cord from the charging station. The current sense circuit may be connected to a microcontroller that receives the signal from the current sense circuit. The microcontroller may process the signal to determine the amount of charging current passing from the charging station through the power cord to the electric vehicle, and hence the amount of power being transferred to the electric vehicle. As well, the microcontroller may determine the charging status (e.g., whether charging is proceeding normally), the amount of time elapsed since charging began, and the remaining time until charging is completed. This information may thereafter be provided to the display unit and displayed to the users. This display unit, the microcontroller, the current sense circuit, as well as other electronic components in the self-contained EVCS accessory, may be powered by any suitable portable power supply, including a lithium-ion battery. Power may also be derived from the charging station itself via the secondary side of the current transformer.

In some embodiments, the self-contained EVCS accessory may also obtain cost information on a near real-time basis for the power being transferred to the electric vehicle. To this end, the self-contained EVCS accessory may include a wired or wireless communication interface for allowing the EVCS accessory to communicate with a designated database for an electric utility company. The electric utility database may provide the self-contained EVCS accessory with cost information, typically on a price per kilowatt hour basis, for the power being transferred to the electric vehicle. Where a wireless communication interface is used, the wireless communication interface may be a cellular interface, a radio interface, a satellite interface, and the like. The wireless communication interface may also be a Wi-Fi interface that connects to a local area network for communicating with the electric utility server. As well, the Wi-Fi interface, or a Bluetooth interface, or other short-range wireless communication interface, may also be used by the self-contained EVCS accessory to communicate with the electrical vehicle to obtain, for example, the charge level of the electric vehicle.

In some embodiments, a user input, such as a pushbutton, scroll wheel, and the like, may be provided on the self-contained EVCS accessory to allow users to select and/or cycle through the detailed information available for display on the display unit. In alternative embodiments, the display unit may be a touchscreen display that allows users to select the information for display by touching the touchscreen display at the appropriate location.

In some embodiments, the detailed information available to be displayed on the display unit may also be retrieved and displayed on the users' smartphone on a near real-time basis. In these embodiments, the self-contained EVCS accessory may upload the available information to a central server from where the information may be downloaded to the users' smartphone via an appropriate smartphone application. Alternatively, the user may send a text message to the central server with a specific text code and the server may respond with a text message containing the detailed information displayed on the display unit. It is also possible for the user's smart phone to access the EVCS accessory directly using the Wi-Fi, Bluetooth, or other short-range communication interface.

In general, in one aspect, the disclosed embodiments are directed to an accessory for an electric vehicle charging station. The accessory comprises a housing separate from and external to the electric vehicle charging station, the housing configured to be electrically engaged with a power cord of the electric vehicle charging station, and a display unit mounted on the housing and configured to display detailed charging information related to an electric vehicle charging process in near real time. The accessory further comprises a processor within the housing and connected to the display unit, the processor configured to provide the detailed charging information to the display unit, and a current sense circuit within the housing and connected to the processor, the current sense circuit configured to provide the processor with a signal indicative of an amount of electric current being supplied by the electric vehicle charging station through the power cord in near real time during the electric vehicle charging process. The processor is further configured to determine at least a portion of the detailed charging information provided to the display unit using the signal provided by the current sense circuit.

In general, in another aspect, the disclosed embodiments are directed to a system for monitoring an amount of power being supplied to an electric vehicle by an electric vehicle charging station during an electric vehicle charging process. The system comprises a self-contained accessory separate from and external to the electric vehicle charging station, the self-contained accessory configured to electrically engage a power cord of the electric vehicle charging station and to display detailed charging information related to the electric vehicle charging process. A communication interface in the self-contained accessory is configured to connect the self-contained accessory to a Web server over a communication network, the Web server configured to store the detailed charging information and provide the detailed charging information upon receiving an authenticated request. The self-contained accessory is further configured to send the detailed charging information to the Web server in near real time during the electric vehicle charging process over the communication network using the communication interface.

BRIEF DESCRIPTION OF THE DRAWINGS

The foregoing and other advantages of the disclosed embodiments will become apparent upon reading the following detailed description and upon reference to the drawings, wherein.

DETAILED DESCRIPTION OF THE DISCLOSED EMBODIMENTS

As an initial matter, it will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Figure 1:
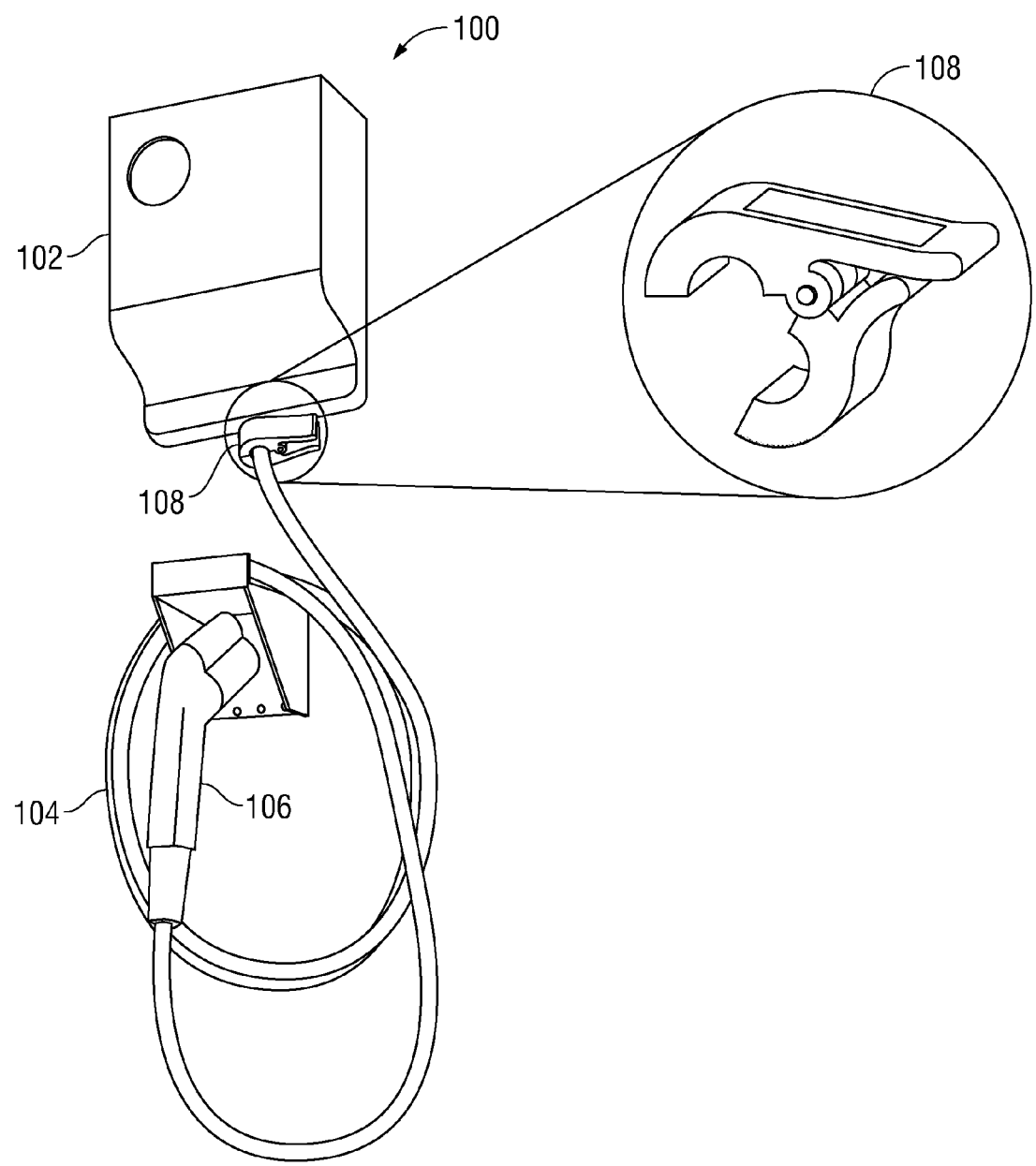
FIG. 1 illustrates an exemplary self-contained EVCS accessory attached to an electric vehicle charging station according to some implementations of the disclosed embodiments.

Referring now to FIG. 1, a typical charging station 100 for an electric vehicle (not shown) is shown with which an EVCS accessory 108 according to the disclosed embodiments may be used to display detailed information about the vehicle charging process to users. Advantageously, the EVCS accessory 108 is entirely self-contained, relying on its own independent display unit and internal processing so no modification or alteration is needed to the charging station 100. As such, although it is discussed primarily with respect to an electric vehicle charging station, the self-contained EVCS accessory 108 may also be used with many other applications where it would be useful to provide detailed information about the amount of charging current flowing through an electrical cable.

As can be seen in FIG. 1, the charging station 100 includes a housing 102 that houses the various components making up the charging station 100, an EVCS cable 104 that carries charging current to charge the electric vehicle, and a connector 106 that connects the EVCS cable 104 to the electric vehicle. Collectively, the cable 104 and connector 106 will be referred to as the "power cord" of the EVCS. In general operation, a user wishing to recharge an electric vehicle simply connects the connector 106 to a corresponding socket on the electric vehicle to begin charging his/her vehicle. As mentioned above, however, existing charging stations include only a rudimentary display, typically one or more LEDs or indicator lights, that convey only basic information about the charging process to users.

In accordance with the disclosed embodiments, a self-contained EVCS accessory 108 may be attached to or electrically engaged with the EVCS cable 104 that can display detailed information about the charging process. As used herein, the term "electrically engaged" means the EVCS accessory is coupled or linked by electromagnetic induction to the EVCS cable or the connector. The detailed information enables users to make more meaningful and intelligent decisions about charging their electric vehicles and potentially their overall driving habits. In the embodiment shown, the EVCS accessory 108 is in the form of a clamp that may be attached around the EVCS cable 104 to monitor the amount of charging current flowing through the EVCS cable 104 and derive various details about the charging process. This allows the EVCS accessory 108 to be retrofitted to the charging station 100 without modifying, altering, or replacing the charging station 100. The EVCS accessory 108 then uses its own separate and independent display unit to provide the derived information to users, including vehicle charge level, charging status, elapsed time and remaining time, cost per kilowatt, total cost, power transferred, and the like. Of course, other form factors besides a clamp may be used without departing from the scope of the disclosed embodiments, as discussed later herein.

Figure 2:
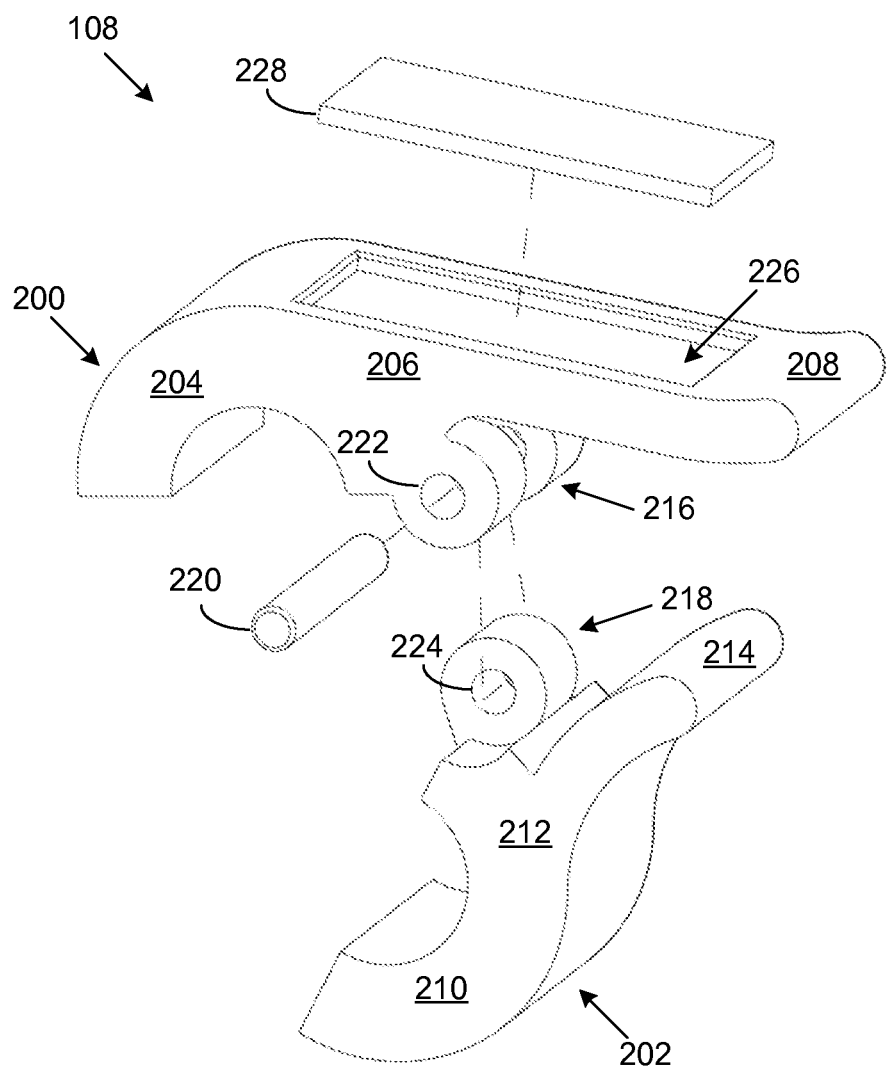
FIG. 2 illustrates an exploded perspective view of the exemplary self-contained EVCS accessory of FIG. 1 according to some implementations of the disclosed embodiments.

FIG. 2 is an exploded perspective view of the EVCS accessory 108. As can be seen, the EVCS accessory 108 is composed of two main components, a first clamp half 200 and a second clamp half 202. The first clamp half 200 includes a jaw portion 204 that is rounded or semicircular for receiving the EVCS cable 104, a substantially straight body portion 206, and an end portion 208 that curves somewhat to facilitate gripping by a user. Likewise, the second clamp half 202 includes a rounded or semicircular jaw portion 210, a substantially straight body portion 212, and a slightly curved end portion 214. In addition, the first clamp half 200 includes a hinge portion 216 that is configured to mate or otherwise receive a complimentary hinge portion 218 on the second clamp half 202. A hinge pin 220 may be inserted in hinge openings 222, 224 formed in the hinge portions 216, 218 of the first and second clamp halves 200, 202, respectively, to hold the two clamp halves together and allow them to be articulated. Although not expressly shown, a helical spring may be affixed between the two clamp halves 200, 202 behind the hinge portions 216, 218 to urge the jaw portions 204, 210 of the two clamp halves together.

In the embodiment of FIG. 2, one of the clamp halves 200, 202, for example the first clamp half 200, may have a recessed area 226 formed on the body portion 206 of the first clamp half. A display unit 228 having substantially the same size as the recessed area 226 may then be disposed in the recessed area 226 to provide a human machine interface (HMI). In general, any suitable display capable of displaying numeric or alphanumeric information may be used as the display unit 228, including a flat-panel LED display, bistable LCD display, and dynamic display. Low power displays such as interferometric modulation (IMOD) displays that can operate on a milliwatt of power, organic LED (OLED) displays, carbon nano tube displays, and the like may also be used. Such a display unit 228 may then be used to present information about the charging process separately and independently of any of the LEDs or light indicators on the charging station 100.

Figure 3:
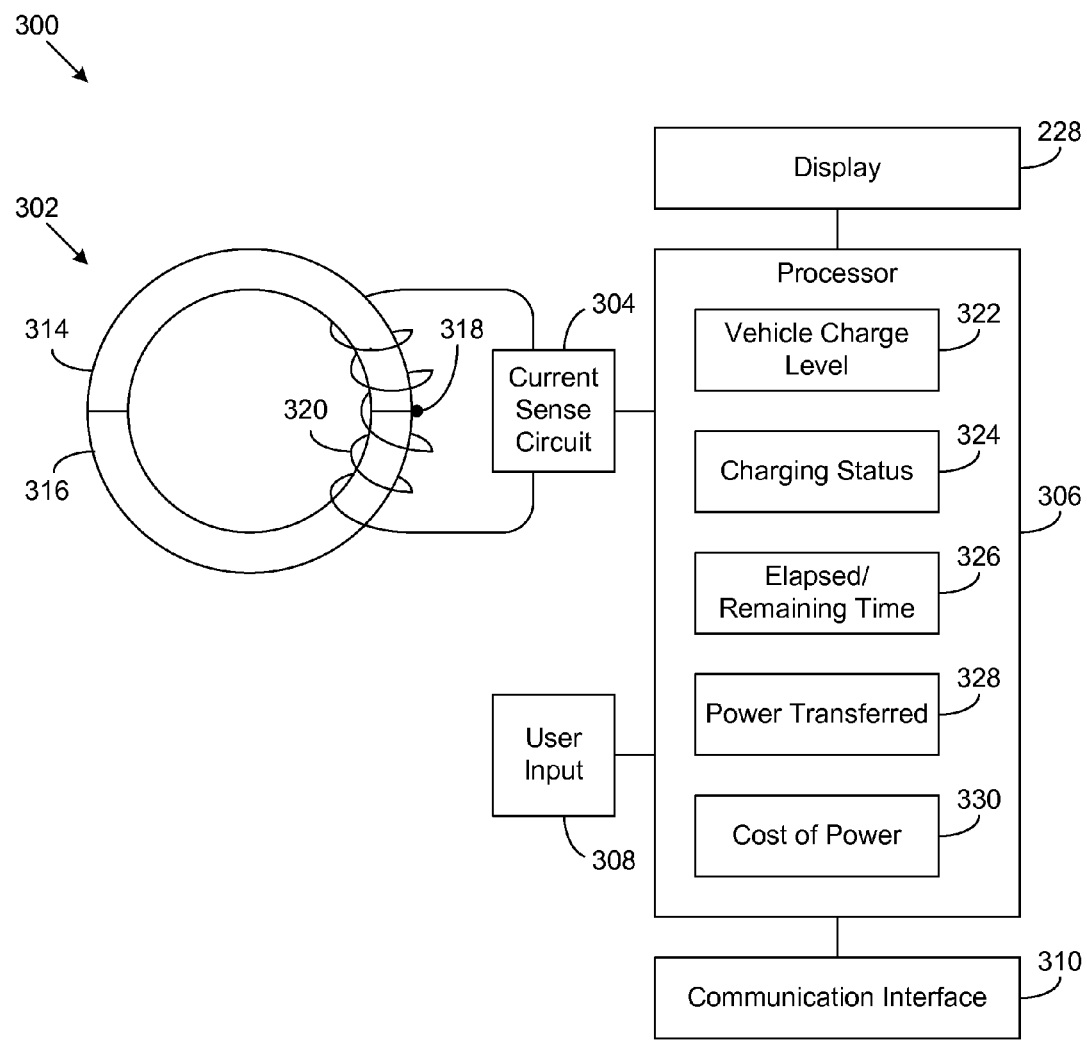
FIG. 3 illustrates an exemplary functional diagram of the self-contained EVCS accessory according to some implementations of the disclosed embodiments.

In some embodiments, the detailed information about the charging process displayed by the display unit 228 may be derived by a charge monitoring system deployed in the EVCS accessory 108, indicated generally at 300 in FIG. 3. The charge monitoring system 300 may be mounted or otherwise housed within the EVCS accessory 108 inside the first and second clamp halves 200, 202. In preferred embodiments, the monitoring system 300 may implemented on one or more circuit boards (not expressly shown) that electrically interconnect one or more components of the charge monitoring system 300. To facilitate housing the one or more circuit boards, the first and second clamp halves 200, 202 may be hollow on the inside, or they may have specially formed cavities or pockets (not expressly shown) for receiving the circuit boards.

As can be seen in FIG. 3, the charge monitoring system 300 may include a split core current transformer 302 connected to a current sense circuit 304 that operates to sense current passing through the EVCS cable 104. The charge monitoring system 300 may further include a processor 306 connected to and receiving current sense signals from the current sense circuit 304 that reflect the amount of charging current passing through the EVCS cable 104. The display unit 228 may then be connected to and receive display signals from the processor 306 to display the detailed information regarding the charging process. A user input 308 in the charge monitoring system 300, such as a pushbutton, scroll wheel, and the like, may be connected to the processor 306 to allow users to select the particular details of the charging process to display. It is also possible to provide the user input via finger gestures in embodiments where the display unit 228 is a touchscreen.

A communication interface 310 may be connected to or integrated with the processor 306 to allow the processor 306 to communicate with external devices and systems as needed. The communication interface 310 may be a wired or wireless communication interface, or it may include both capabilities. Where a wireless communication interface is used, the communication interface 310 may be a cellular interface, a radio interface, a satellite interface, and the like. The communication interface 310 may also be a Wi-Fi interface, a Bluetooth interface, or other short-range wireless communication interface for allowing the EVCS accessory 108 to communicate, for example, with a local area network, the electrical vehicle itself, smart phones and other mobile devices, and the like.

Power for the various components of the charge monitoring system 300 and the display 228 may be provided either by a lithium ion battery or the like (not expressly shown), or tapped from the charging station 100 via the secondary side of the current transformer 302. Alternatively (or in addition), a small amount of charging current flowing through the EVCS cable 104 may be captured by the EVCS accessory 108 and used to energize the display unit 228.

In operation, charging current flowing through the EVCS cable 104, which is the primary side, causes electric charge to circulate in the split core current transformer 302 that is sensed and processed (e.g., conditioned, etc.) by the current sense circuit 304. A split core current transformer 302 is used in order to accommodate the two clamp halves 200, 202 of the EVCS accessory 108. The split core current transformer 302 is composed of two core halves, a first transformer core half 314 and a second transformer core half 316. The two transformer core halves 314, 316 are then mounted or otherwise secured in the first and second clamp halves 200, 202, respectively, one transformer core half within each clamp half. A hinge assembly 318 is provided for holding the two transformer core halves 314, 316 together and allowing them to be articulated along with the first and second clamp halves 200, 202 so the EVCS accessory 108 may be closed around the EVCS cable 104. A transformer winding 320 encircling the split core current transformer 302 provides a secondary side current to the current sense circuit 304 that is indicative of the amount of charging current passing through the EVCS cable 104.

Based on the secondary side current provided by the transformer winding 320, the current sense circuit 304 outputs a signal to the processor 306 that reflects the amount of current passing through the EVCS cable 104. The processor 306 may then use this signal to determine various details about the vehicle charging process. Such a processor 306 may be any suitable processing unit known to those having ordinary skill in the art, including a microcontroller, a field programmable gate array (FPGA), and application-specific integrated circuit (ASIC), and the like. In particular, the processor 306 may be programmed with several modules or routines for determining the details of the vehicle charging process. These modules or routines may include, for example, a vehicle charge level module 322, a charging status module 324, an elapsed/remaining time module 326, a power transferred module 328, and a cost of power module 330.

The vehicle charge level module 322 generally operates to determine the present charge level of the electric vehicle in near real time. This information may then be displayed by the display unit 228 to let users know how full or depleted (e.g., 25%, 50%, 75%, 100%, etc.) their electric vehicle may be. In some embodiments, the vehicle charge level module 322 may determine the charge level independently using techniques known to those having ordinary skill in the art, or it may employ the communication interface 310 to communicate with and obtain this information from the electric vehicle itself.

The charging status module 324, as the name suggests, operates to determine the status of the charging process. This information may then be displayed by the display unit 228 to let users know how the charging process is proceeding. For example, the charge status may include normal, stopped, caution, and the like, depending on whether and how much current is flowing from the charging station 100 through the EVCS cable 104 to the electric vehicle.

The elapsed/remaining time module 326 operates to determine the amount time that has elapsed since charging began and also how much time remains until the electric vehicle is fully charged. In the latter case, the elapsed/remaining time module 326 may leverage the information determined or obtained by the electric vehicle charge level module 322 to determine the remaining charge time. It is of course possible to skip determining the remaining time determination or the elapsed time determination without departing from the scope of the disclosed embodiments.

The power transferred module 328 operates to determine the total amount of power that has been transferred from the charging station 100 to the electric vehicle in near real time. This information is typically provided in kilowatts and may be determined from the amount of current flowing through the EVCS cable 104 (based on the output from the current sense circuit 304) and the elapsed time information determined by the elapsed/remaining time module 326.

The cost of power module 330 operates to determine the monetary value of the power being transferred to the electric vehicle. This information may then be displayed by the display unit 228 to let users know how much they are being charged for charging their electric vehicle. In some embodiments, the cost information may be provided on price per kilowatt basis, which basis may also be used to determine and provide the total price for the charging session on a near real-time basis. The per kilowatt price is typically set by the electric utility company and may be obtained on a regular basis (e.g., half-hourly, hourly, daily, etc.) and stored either on the processor 306 or a local storage device (not expressly shown) connected to the processor 306. Alternatively, the per kilowatt price may be downloaded by the cost of power module 330 over a network (e.g., the Internet) from a designated pricing database of the electric utility company as needed on a near real-time basis via the communication interface 310.

Figure 4:
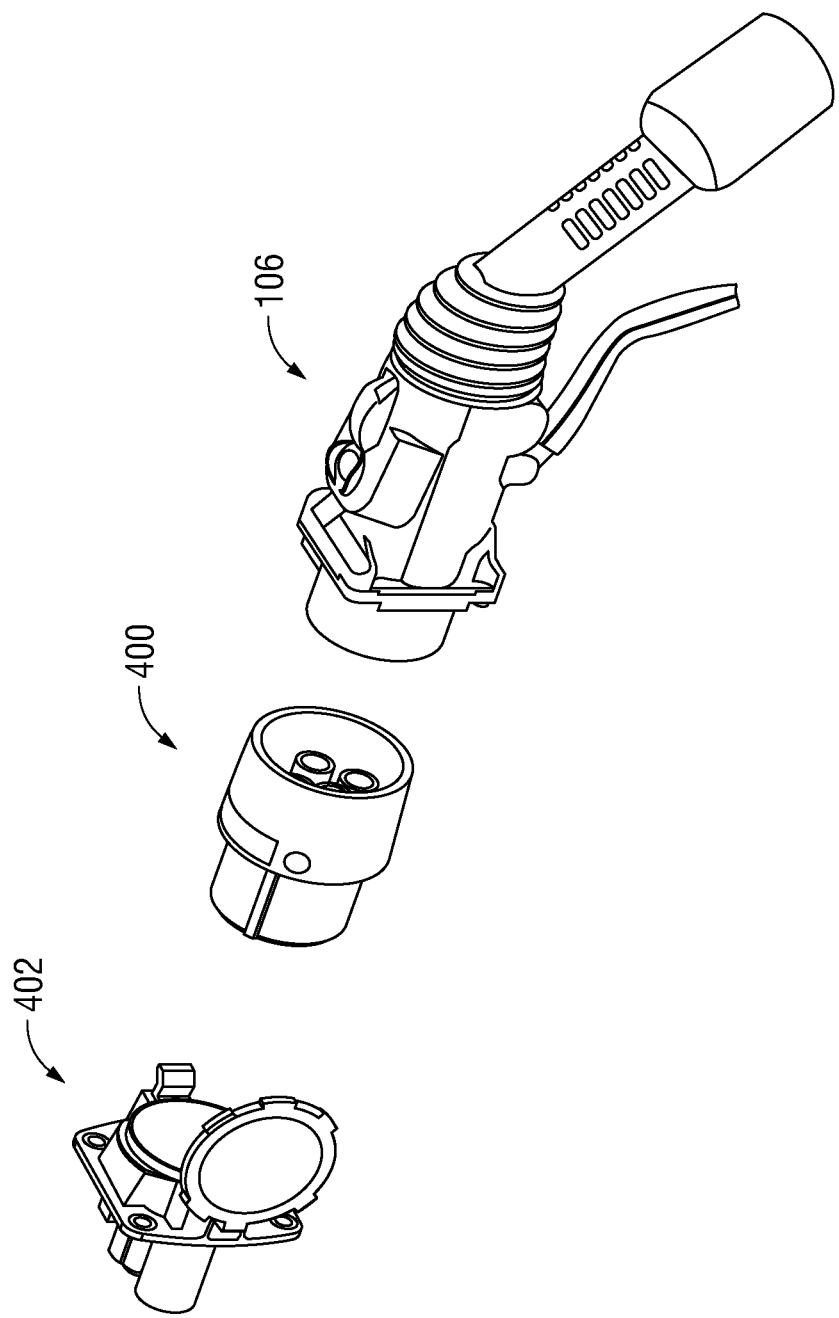
FIG. 4 illustrates another exemplary self-contained EVCS accessory between a handle and an EV socket according to some implementations of the disclosed embodiments.

Thus far, the EVCS accessory 108 has been described in terms of a clamp that may be attached around the EVCS cable 104 of the charging station 100. As mentioned earlier, other form factors besides the clamp may also be used. For example, FIG. 4 shows an EVCS accessory 400 that is otherwise similar to the EVCS accessory 108 of FIG. 1 in terms of functionality, but is implemented in the form of an adapter that fits on the end of the EVCS connector 106. Like the EVCS accessory 108 of FIG. 1, the EVCS accessory 400 is entirely self-contained, including having its own separate display unit, so that it may be retrofitted to the charging station without modifying or altering the charging station 100. Such an EVCS accessory 400 may then be connected to the end of the EVCS connector 106 and plugged into an EVCS socket 402 of an electric vehicle in the same way the EVCS connector 106 is normally plugged into the EVCS socket 402. The EVCS accessory 400 may thereafter be used to derive and display various details about the charging process independently of the charging station 100.

Figure 5:
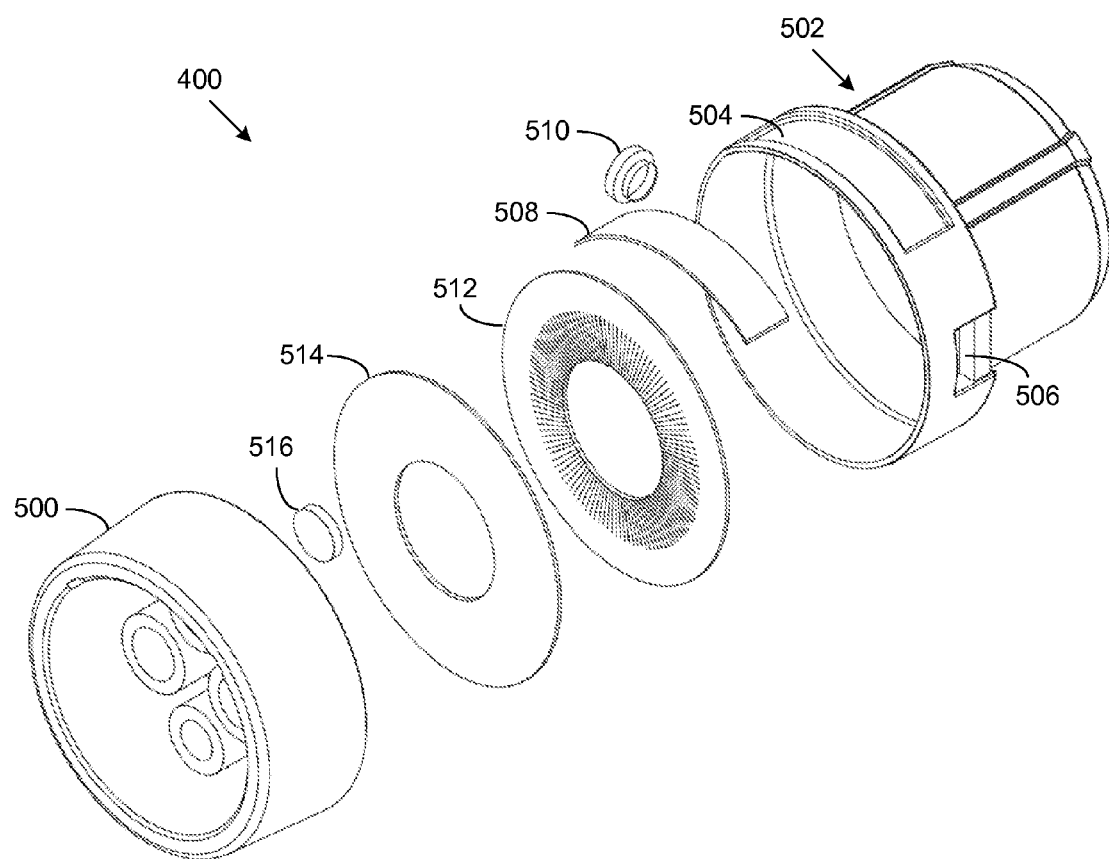
FIG. 5 illustrates an exploded perspective view of the exemplary EVCS accessory of FIG. 4 according to some implementations of the disclosed embodiments.

An exploded perspective view of the EVCS accessory 400 having an adapter form factor is illustrated in FIG. 5. As can be seen in this example, the EVCS accessory 400 may include a generally cylindrical shaped adapter housing composed of a connector portion 500 and a socket portion 502. The connector portion 500 is designed to be connected to the EVCS connector 106 while the socket portion 502 is designed to be connected to the EVCS socket 402. When assembled, the connector portion 500 and the socket portion 502 allow the EVCS accessory 400 to fit and function in all relevant aspects the same way the EVCS connector 106 fits and functions in the EVCS socket 402 while also housing and protecting the various components of the EVCS accessory 400. A recessed area 504 and an opening 506 in the socket portion 502 allow a display unit 508 and a user input 510, respectively, to be mounted on the socket portion 502. As with their counterparts above, the display unit 508 may be any suitable display unit capable of displaying numeric or alphanumeric information, including a flat-panel LED display, bistable LCD display, dynamic display, and the like, and the user input 510 may be a pushbutton, scroll wheel, and the like.

Other components housed within the EVCS accessory 400 may include a current transformer 512, which may be a toroid transformer or other transformer that can operate within the generally cylindrical shape housing of the EVCS accessory 400 to sense the charging current flowing to the electric vehicle. As well, a toroid or annular shaped printed circuit board 514 may be housed within the EVCS accessory 400 for electrically interconnecting the various electronic circuits of the EVCS accessory 400 to one another, such as a current sense circuit, a processor, a communication interface, and the like (see FIG. 3). A battery 516, such as a lithium ion battery or the like, may be provided to power the circuit board 514 and the display unit 508 of the EVCS accessory 400. Alternatively (or in addition), power may be tapped from the charging station 100 via the secondary side of the current transformer 512 in order to power the circuit board 514 and the display unit 508. And as mentioned above, a small amount of charging current flowing through the EVCS cable 104 may be captured by the EVCS accessory 400 and used to energize the display unit 508.

Figure 6A:
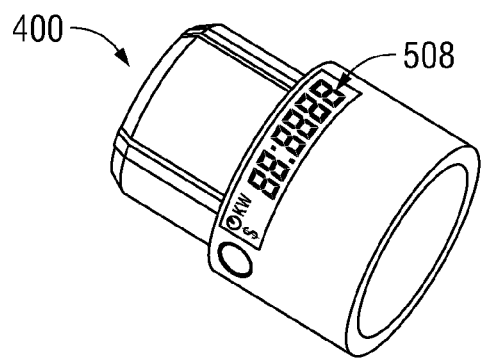
FIGS. 6A-6D illustrate examples of the detailed information that may be displayed on the exemplary self-contained EVCS accessory according to some implementations of the disclosed embodiment.
Figure 6B:
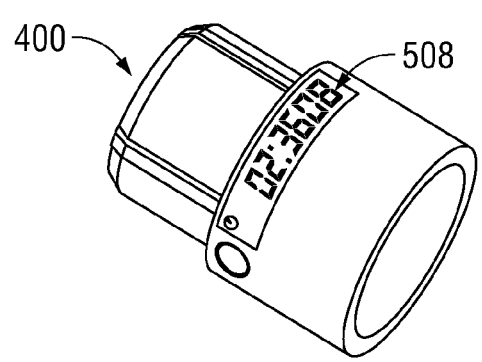

Examples of the display unit 508 displaying various types of information about the charging process may be seen in FIGS. 6A-6B. As can be seen in FIG. 6A, the display unit 508 may be a flat-panel LED display, but other types of display units may certainly be used, as mentioned previously. Such a flat-panel LED display 508 includes a plurality of LED segments that may be combined to form different numeric and alphanumeric characters. Various icons may also be provided representing various charging metrics, such as time (a clock icon), power (a kW icon), and currency (a dollar icon).

Figure 6C:
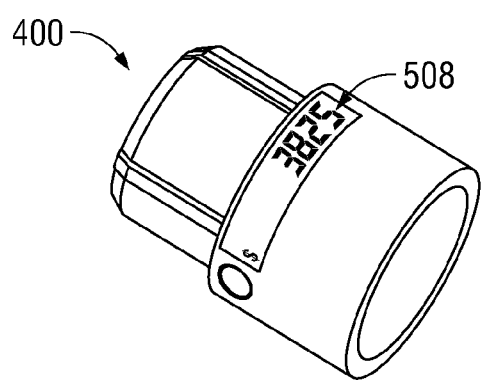
Figure 6D:
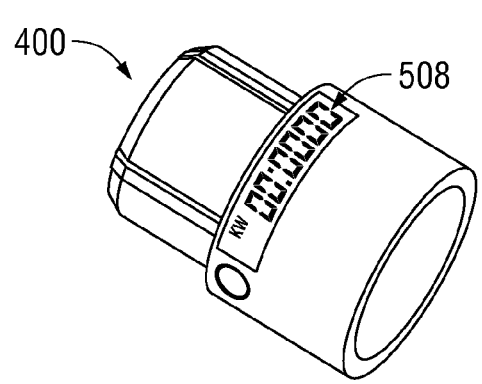

FIG. 6B is an example of the display unit 508 displaying elapsed charging time. FIG. 6C is an example of the display unit 508 displaying total charging cost in near real time. FIG. 6D is an example of the display unit 508 displaying the amount of power transferred in near real time. Other types of detailed information regarding the charging process besides the above may also be displayed by the display unit 508 without departing from the scope of the disclosed embodiments.

Figure 7:
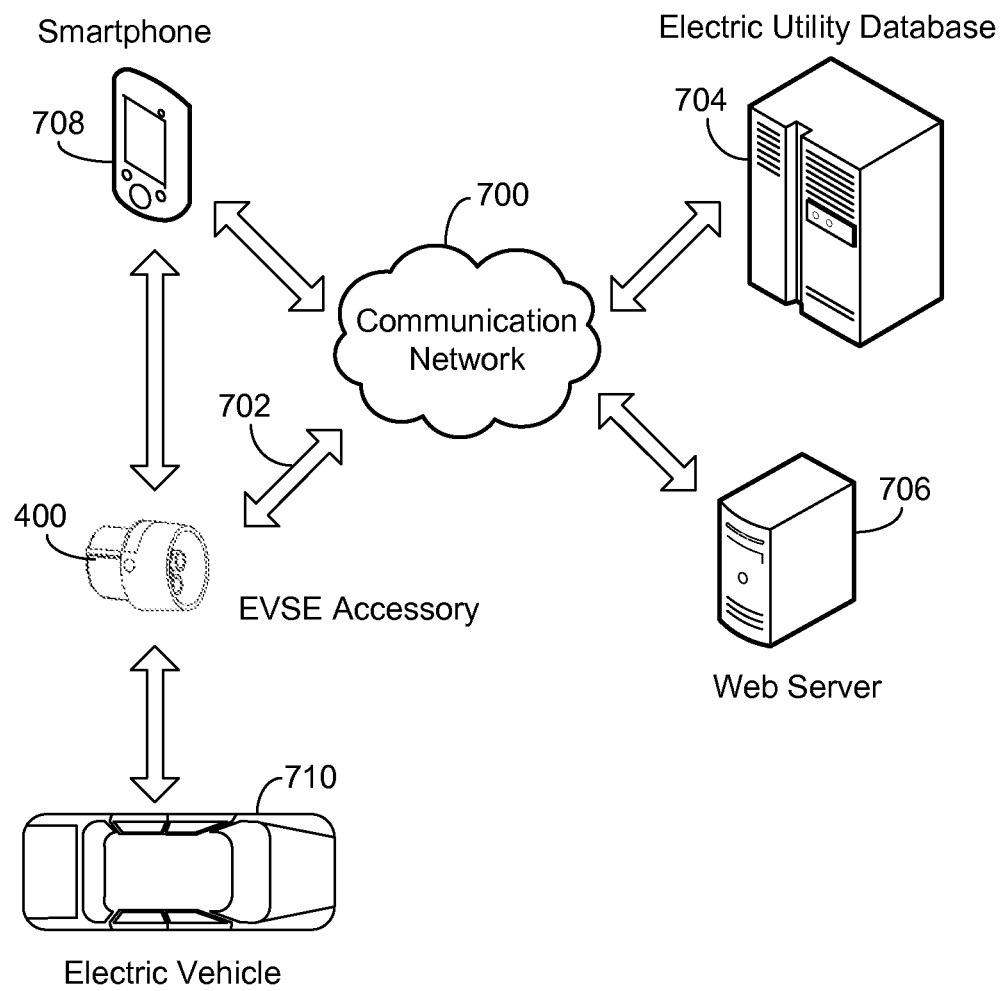
FIG. 7 illustrates an exemplary wireless communication network that may be used by the self-contained EVCS accessory according to some implementations of the disclosed embodiments.

In some embodiments, the detailed charging information displayed by the display unit 508 may need to be derived based on information obtained from an external source using the EVCS accessory's communication interface. This is depicted in FIG. 7, where the EVCS accessory 400 is connected to a communication network 700, such as the Internet, over a wired and/or wireless network connection, indicated generally at 702. The communication network 700 allows the EVCS accessory 400 to communicate with any number of external devices and systems, including an electric utility company database 704, a Web server 706, a smartphone or other mobile devices 708, and the like. By adhering to the appropriate communication protocol (e.g., HTTP, FTP, Telnet, etc.), which may include one or more authentication requirements, the EVCS accessory 400 may obtain information such as, for example, the cost for the power being used from the electric utility company database 704, typically in price-per-kilowatt, on a regularly scheduled basis or as needed in near real time.

Similarly, the communication network 700 allows the EVCS accessory 400 to communicate various types of information to the Web server 706 over the wired and/or wireless network connection 702. For example, the EVCS accessory 400 may upload detailed charging information that it derived or obtained to the Web server 706 in near real time during the charging process for subsequent remote access by users. Users may then access this detailed information from their smartphones or other mobile devices 708 as well as from their desktop or laptop computers by following the appropriate communication protocols, including any authentication requirements. In some embodiments, an application may be specifically developed to run on the smartphones or other mobile devices 708 in order to facilitate obtaining the detailed information from the Web server 706. Such an application may automatically access the Web server 706, for example, and download the detailed information whenever it detects or is notified that the detailed information has been updated. Alternatively, the user may send a text message to the Web server 706 with a specific text code using an appropriate text messaging application, and the Web server 706 may respond with a text message containing the detailed charging information.

In some embodiments, the smartphones or other mobile devices 708 may also access the EVCS accessory 400 directly via a Wi-Fi, Bluetooth, or other short-range wireless network connection to obtain detailed charging information similar to the information uploaded to the Web server 706. In a similar manner, the short-range wireless network connection may also be used by the EVCS accessory 400 to communicate with the electrical vehicle 710 in order to obtain, for example, the charge level and other detailed charging information directly from the electric vehicle. Note that although the EVCS accessory 400 depicted in FIG. 7 has the adapter form factor, it should be understood that the foregoing discussion applies equally to the EVCS accessory 108 having the clamp form factor.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the spirit and scope of the disclosed embodiments as defined in the appended claims.

What is claimed is:

1. An accessory for an electric vehicle charging station, comprising:
    a housing separate from and external to the electric vehicle charging station, the housing being composed of a first clamp member and a second clamp member configured to clamp around a power cord of the electric vehicle charging station;
    a display unit mounted on the housing and configured to display detailed charging information related to an electric vehicle charging process in near real time;
    a processor within the housing and connected to the display unit, the processor configured to provide the detailed charging information to the display unit; and
    a current sense circuit within the housing and connected to the processor, the current sense circuit including a split core transformer configured to provide the processor with a signal indicative of an amount of electric current being supplied by the electric vehicle charging station through the power cord in near real time during the electric vehicle charging process, the split core transformer having a first transformer core portion mounted within the first clamp member, a second transformer core portion mounted within the second clamp member, and a hinge assembly holding the first transformer core portion and the second transformer core portion together;
    wherein the processor is further configured to determine at least a portion of the detailed charging information provided to the display unit using the signal provided by the current sense circuit; and
    wherein the housing of the accessory is a clamp configured to be clamped around the power cord of the electric vehicle charging station.

2. The accessory of claim 1, further comprising a current transformer within the housing and connected to the current sense circuit, the current transformer configured to provide an output reflecting the electric current being supplied by the electric vehicle charging station through the power cord.

3. The accessory of claim 2, further comprising a power supply within the housing and connected to the processor and the current sense circuit, the power supply providing power to the processor and the current sense circuit.

4. The accessory of claim 3, wherein the power supply is one of: the current transformer, or a battery.

5. The accessory of claim 1, wherein the display unit is a low power display unit.

6. The accessory of claim 1, further comprising a user input mounted on the housing and configured to allow a user to select which detailed charging information to display on the display unit.

7. The accessory of claim 1, wherein the detailed charging information includes: charge level of an electric vehicle being charged, charging status of the electric vehicle charging station, elapsed time of the charging process, amount of power being transferred, and cost of the power being transferred.

8. A system for monitoring an amount of power being supplied to an electric vehicle by an electric vehicle charging station during an electric vehicle charging process, comprising:
 a self-contained accessory separate from and external to the electric vehicle charging station, the self-contained accessory having a first clamp member and a second clamp member configured to clamp around a power cord of the electric vehicle charging station and to display detailed charging information related to the electric vehicle charging process;
 a split core transformer having a first transformer core portion mounted within the first clamp member, a second transformer core portion mounted within the second clamp member, and a hinge assembly holding the first transformer core portion and the second transformer core portion together; and
 a communication interface in the self-contained accessory configured to connect the self-contained accessory to a Web server over a communication network, the Web server configured to store the detailed charging information and provide the detailed charging information upon receiving an authenticated request;
 wherein the self-contained accessory is further configured to send the detailed charging information to the Web server in near real time during the electric vehicle charging process over the communication network using the communication interface.

9. The system of claim 8, wherein the communication network is a wireless communication network, the wireless communication network configured to connect the self-contained accessory to the Web server over the Internet.

10. The system of claim 8, wherein the authenticated request is from a smartphone application and the Web server is configured to provide the detailed charging information to the smartphone application.

11. The system of claim 8, wherein the authenticated request is from a text messaging application and the Web server is configured to provide the detailed charging information to the text messaging application.

12. The system of claim 8, wherein the self-contained accessory is further configured to be connected to the electric vehicle over a wireless communication network and to obtain at least a portion of the detailed charging information from the electric vehicle.

13. The system of claim 8, wherein the detailed charging information displayed by the self-contained accessory includes at least one of: charge level of the electric vehicle, charging status of the electric vehicle charging station, elapsed time of the charging process, amount of power being transferred, and cost of the power being transferred.

14. The accessory of claim 1, wherein the first and second clamp members each include a rounded jaw portion, a straight body portion extending from the rounded jaw portion, and a curved end portion extending from the straight body portion.

* * * * *